United States Patent [19]
Vandevier et al.

[11] 3,976,919
[45] Aug. 24, 1976

[54] PHASE SEQUENCE DETECTOR FOR THREE-PHASE AC POWER SYSTEM

[75] Inventors: Joseph E. Vandevier, Tulsa, Okla.; David R. Ellis-Anwyl, Long Beach, Calif.

[73] Assignee: Borg-Warner Corporation, Chicago, Ill.

[22] Filed: June 4, 1975

[21] Appl. No.: 583,719

[52] U.S. Cl. .............................. 317/47; 317/27 R; 324/83 D; 307/232; 328/133
[51] Int. Cl.² ........................................ H02H 3/26
[58] Field of Search ............ 317/47, 27 R, 46, 13 R, 317/33 SC; 328/133, 155; 324/83 R, 83 D, 83 A, 86; 307/232, 127; 340/253 H, 253 Y; 318/683

[56] References Cited
UNITED STATES PATENTS

| | | | |
|---|---|---|---|
| 3,633,115 | 1/1972 | Epstein | 328/155 X |
| 3,778,723 | 12/1973 | Schaefer | 328/133 |
| 3,825,768 | 7/1974 | Grygera | 317/27 R X |

*Primary Examiner*—J D Miller
*Assistant Examiner*—Patrick R. Salce
*Attorney, Agent, or Firm*—James E. Tracy

[57] ABSTRACT

The phase sequence of the phase currents supplied by a three-phase AC power supply to a phase-sensitive load (such as a three-phase AC motor) is monitored by developing three phase-displaced, rectangular shaped logic signals, respectively representing the three phase currents, and applying these logic signals to respective ones of the J, C and K inputs of a J-K flip-flop. When the load is correctly connected to the power supply, the phase relationship of the three logic signals will be appropriate to trigger the flip-flop to its set operating state. Any other sequence actuates the flip-flop to its reset state which, in turn, disconnects the load from the power supply.

5 Claims, 5 Drawing Figures

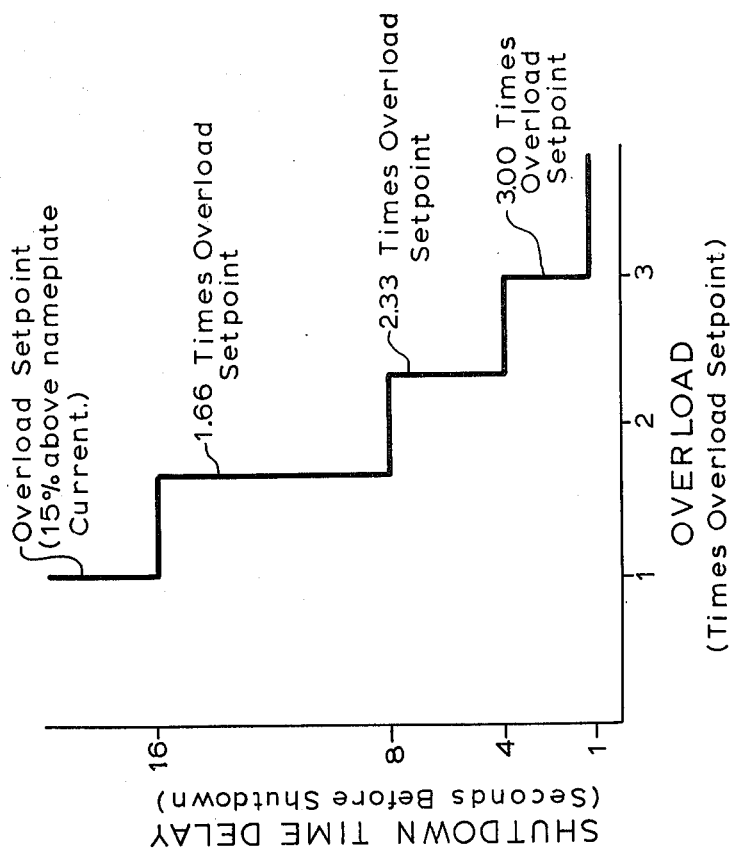
FIG. 5
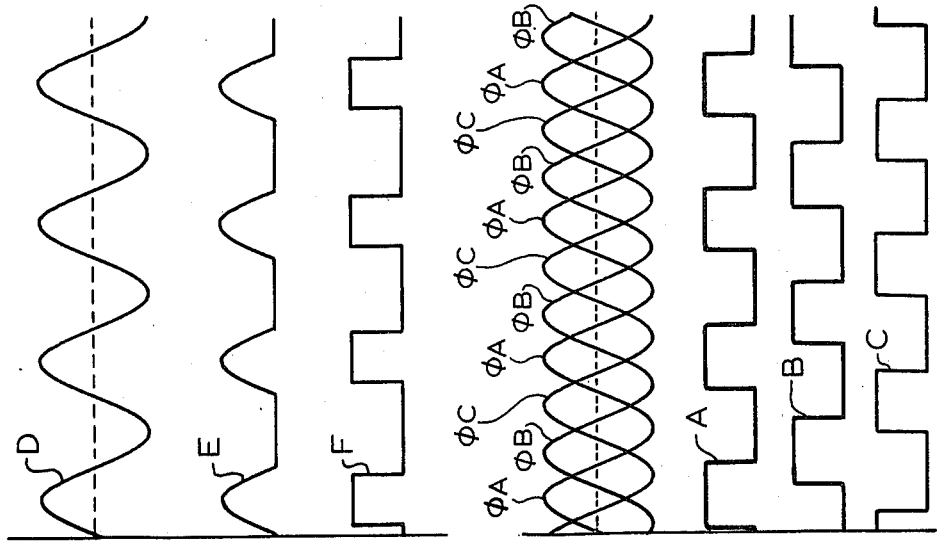
FIG. 3
FIG. 4

PHASE SEQUENCE DETECTOR FOR THREE-PHASE AC POWER SYSTEM

BACKGROUND OF THE INVENTION

This invention relates to a system for sensing the phase sequence of the phase currents supplied to a phase-sensitive, three-phase load to make certain that the load is correctly connected to the three-phase AC power source. While the invention may be employed in any three-phase electrical system where it is desired to monitor the phase sequence, it is particularly attractive when incorporated in the control system (especially a digital logic control system) for a three-phase submersible pump motor used downhole in an oil well, and will be described in that environment.

In pumping fluid from an oil well, one conventional practice is to position a submersible three-phase electric motor and pump assembly in the well bore hole near the bottom thereof. A three-phase AC power supply of appropriate voltage (for example, 1500 volts per phase) couples to and drives the pump motor, which may have a rating of well over 200 horsepower. The average depth of such an oil well is usually around 9,000 feet. Since the pump motor is phase sensitive, it is very important that it be correctly connected to the power supply so that the three phase currents supplied to the motor have the correct phase sequence. Otherwise, the motor will rotate in the wrong direction and the equipment driven by the motor will operate in reverse. As a result, pumping capacity would be reduced and the threaded joints in the pump and interconnecting tubing would tend to unscrew and become disassembled. Hence, it is highly desirable to provide a phase sequence detector for insuring that the pump motor automatically shuts down in the event that a wrong phase sequence occurs.

The present invention provides a novel phase sequence monitoring system for indicating when the three phase currents are incorrectly sequenced and for shutting down the pump motor in the presence of such incorrect sequencing. This is achieved by means of a unique digital logic arrangement which is of relatively inexpensive construction; requires very little power; is highly efficient, accurate and reliable; and can be contained within a very small space.

SUMMARY OF THE INVENTION

The phase sequence detector of the invention is incorporated in a digital logic control system for controlling the coupling of a three-phase AC power supply to a phase-sensitive, three-phase load, such as a submersible pump motor, to regulate the operation thereof. The three phase currents supplied to the load are monitored by the phase sequence detector to determine if a predetermined desired phase sequence exists, thereby determining whether the power supply is correctly connected to the load. Included in the detector is a flip-flop having set and reset operating states and having first, second and third inputs for actuating the flip-flop to its two operating states. It triggers to its set operating state in response to the application of an actuating signal to the second input at the same time that a certain signal condition is present on the first input, and the flip-flop triggers to its reset state in response to the application of an actuating signal to the second input when a given signal condition exists on the third input. There are means responsive to the three phase currents supplied to the three-phase load for producing first, second and third phase-displaced control signals each of which is a function of and represents a respective one of the three phase currents. Means are provided for applying the first, second and third control signals to the first, second and third inputs, respectively. When the predetermined desired phase sequence is present, the first and second control signals effect actuation of the flip-flop to its set operating state. On the other hand, if any other phase sequence exists, the second and third control signals cause actuation of the flip-flop to its reset operating state. The phase sequence detector also comprises means responsive to and controlled by the flip-flop for providing an indication of the operating state of the flip-flop.

DESCRIPTION OF THE DRAWINGS

The features of the invention which are believed to be novel are set forth with particularity in the appended claims. The invention, together with further advantages and features thereof, may best be understood, however, by reference to the following description in conjunction with the accompanying drawings in which:

FIGS. 3 and 4 depict various voltage waveforms that will be helpful in understanding the operation of certain portions of the control system. The voltage waveforms are identified by letter designations and the points in the control system where these various voltages appear are indicated by corresponding encircled letters. FIG. 4 will be particularly useful in describing the operation of the phase sequence detector.

FIG. 5 is a characteristic curve that will be helpful in understanding the operation of the control system.

DESCRIPTION OF THE ILLUSTRATED EMBODIMENT

Figure 1:
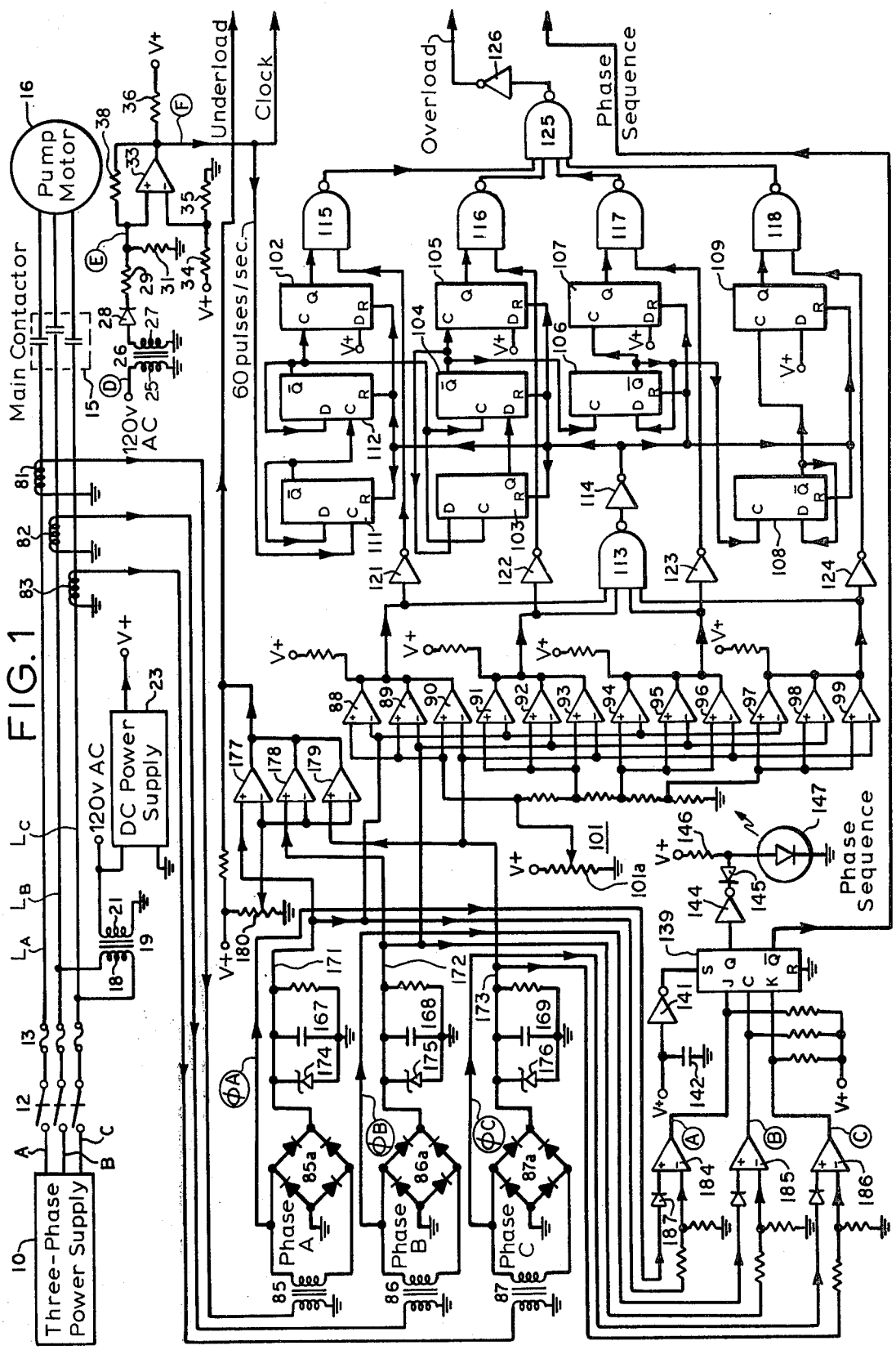
FIGS. 1 and 2 together schematically illustrate a digital logic control system, including a phase sequence detector constructed in accordance with one embodiment of the invention, and the manner in which the control system controls the coupling of a three-phase AC power supply to a three-phase submersible pump motor located near the bottom of an oil well. Of course, FIG. 2 should be placed immediately to the right of FIG. 1 to display the complete control system.
Figure 2:
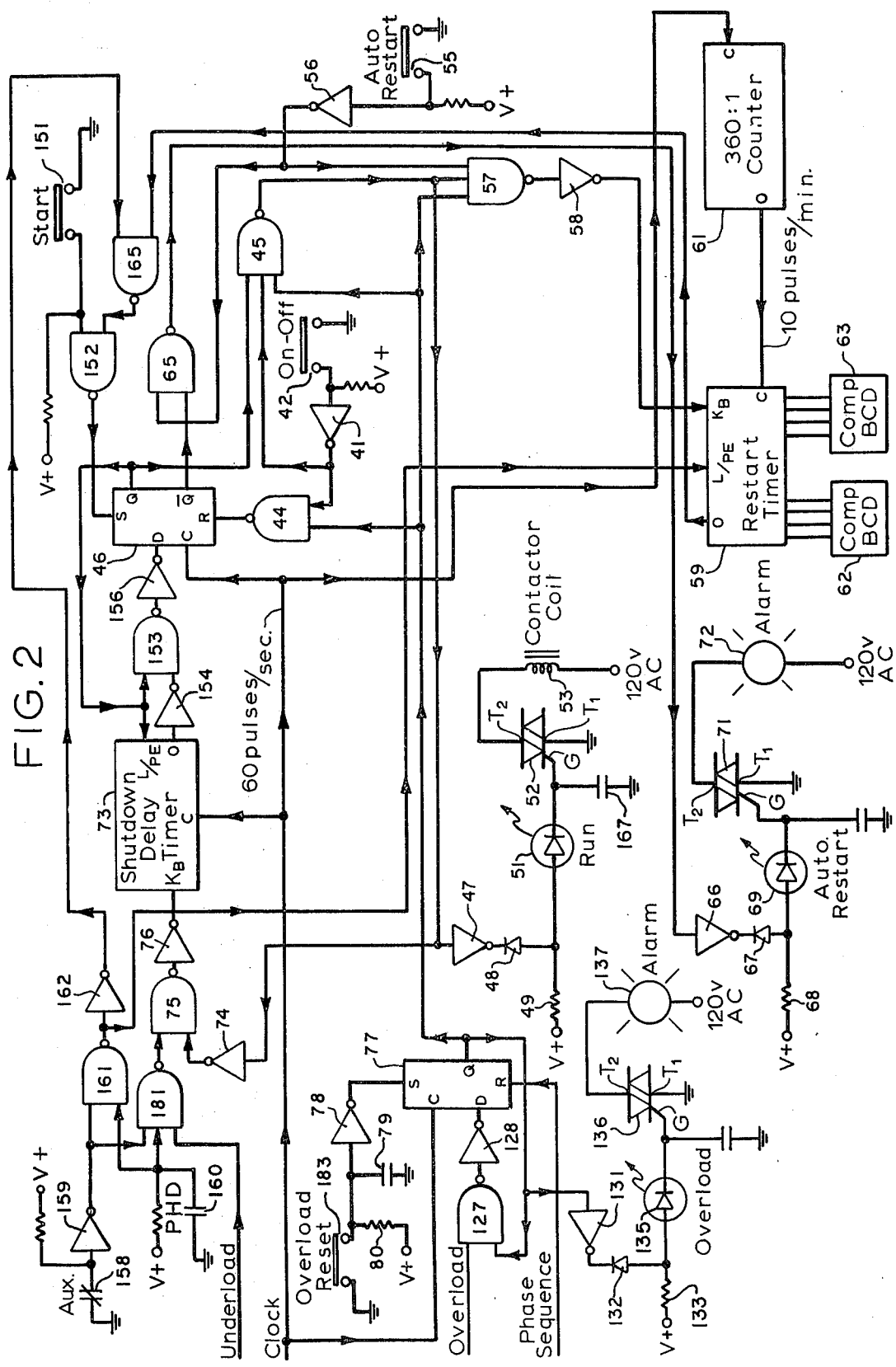

Block 10 represents a three-phase power supply having three outputs each of which provides an alternating voltage (varying in sinusoidal fashion) of the same RMS or root-mean-square amplitude and the same commutating frequency of 60 cycles per second or hertz, the three alternating voltages being phase-displaced with respect to each other by 120°. For convenience, the three phase voltages are designated phases A, B and C as indicated by the labels attached to the three output lines or conductors of power supply 10. Since there is no neutral wire, each of the phase voltages is actually a line-to-line voltage and appears or is produced at one output of supply 10 relative to another of its outputs. The RMS magnitude of each phase voltage may take any appropriate value depending on the characteristics of the motor to be driven. It is not uncommon, for example, to employ for oil wells submersible pump motors requiring phase voltages of 2400 volts. The three output conductors of AC power supply 10 are connected through normally-open main disconnect switch 12, fuses 13, line conductors $L_A$, $L_B$, and $L_C$, and normally-open main contactor 15 to three-phase submersible pump motor 16 which is located down hole in an oil well from which oil is to be pumped out.

When disconnect switch 12 is manually closed by the operator, the control system assumes its "power-up" operating mode. The single phase AC voltage between conductors $L_B$ and $L_C$ is applied to the primary winding 18 of transformer 19 to produce across secondary winding 21 an AC voltage for application to DC power supply 23, which in turn develops a positive DC voltage (labeled V+) for operating all of the logic and switching circuitry in the control system. Preferably, that DC voltage will be around +12 volts and the ground plane of reference potential will be zero volts. Of course, all of the terminals in the drawings marked "V+" are tied or connected to the positive output of DC power supply 23. The high voltage level V+ (or +12 volts) constitutes logic "1" in the digital logic control system and the zero ground voltage represents logic "0".

It is to be noted that transformer 19 has a turns ratio which will be appropriate to develop single phase 120 volts AC across secondary winding 21. The instantaneous voltage at the upper terminal of secondary winding 21 thus alternates at a frequency of 60 hertz and in generally sinusoidal manner above (or positive) and below (or negative) relative to the plane of reference potential or ground to which the lower terminal of the winding is connected. All of the terminals in the drawings marked "120V AC" are tied to the upper or ungrounded terminal of winding 21.

A square wave generator is included in the control system to provide periodically recurring clock pulses that are precisely timed by the frequency of AC power supply 10. The voltage waveforms of FIG. 3 will be helpful in understanding its operation. The 60 hertz, 120 volts AC developed across winding 21 is illustrated by sinusoidal waveform D in FIG. 3 and is applied to primary winding 25 of transformer 26. Secondary winding 27, diode 28 and resistors 29 and 31 provide half wave rectification of the sinusoidal wave, thereby producing at the junction of the resistors the positive half cycles shown in waveform E. The parameters are selected so that the peak amplitude of the positive half cycles is V+ or +12 volts.

Voltage comparator 33, and each of the other comparators shown in the drawings, preferably is of the integrated circuit type LM139 and provides an output potential of either V+, namely logic "1", or zero volts (ground potential) which is logic "0" in the control system. The voltage divider provided by resistors 34 and 35 establishes the negative input of voltage comparator 33 at around +7 volts DC. The output of a type LM139 comparator is the uncommitted collector of a grounded-emitter NPN transistor. Hence, resistor 36 serves as an output "pull-up" resistor. Comparator 33 receives the voltage of waveform E at its positive input and as long as that voltage is less than the potential level (+7 volts) at the negative input, the output of the comparator will be ground potential or logic 0. On the other hand, whenever the voltage at the + input exceeds +7 volts, comparator 33 shifts operating states and produces an output potential of 12 volts or logic 1. As a result, the sharply defined square pulses of waveform F will appear at the output of comparator 33. Resistor 38 provides positive feedback in order to expedite the switching of the comparator between its logic 0 and logic 1 states, thereby obtaining fast rise times and fall times for the pulses of waveform F. Of course, these pulses periodically recur at a frequency of 60 hertz and serve as precisely timed clock pulses for actuating many of the digital logic circuits to be described. A clock bus, connected to the output of comparator 33, supplies the clock pulses to the various logic circuits actuated thereby.

During the power-up operating mode, all of the manually-actuated mechanical switches in the drawings, other than main disconnect switch 12, will be in their open positions as shown Hence, even though DC power supply 23 will be energized and clock pulses are produced, the digital logic control system will still be in its OFF condition during power-up and pump motor 16 will remain de-energized. In this OFF condition, V+ or logic 1 is applied to the input of inverter 41 since ON-OFF switch 42 will be opened. This inverter, as well as each of the other inverters shown in the drawings, preferably is of the integrated circuit type CD4049. Inverter 41 converts the received logic 1 potential to a ground or logic 0 level for application to the right input of NAND gate 44 and to the middle input of NAND gate 45. Each NAND gate in the drawings having two inputs preferably is of the integrated circuit type CD4011, each three-input NAND gate preferably is of the integrated circuit type CD4023, and each four-input NAND gate preferably is of the integrated circuit type CD4012. A NAND gate, regardless of the number of inputs, produces a logic 0 output only when all of its input signals are logic 1. If at least one input is logic 0, the output will be logic 1.

Thus during power-up, a logic 0 at the right input of NAND gate 44 results in the development of a logic 1 signal at the output of the gate which in turn is applied to the R or reset input of D flip-flop 46. Each of the D flip-flops in the control system preferably is of the integrated circuit type CD4013. In addition to an R input, such a flip-flop has a D or data input, an S or set input, and a C or clock input. It has two outputs — Q and $\overline{Q}$. The logic level present at the data input is transferred to the Q output during the positive-going transition of the next clock pulse. Setting or resetting is independent of the clock pulses and is accomplished by impressing a logic 1 signal on the set or reset input, respectively. Specifically, when a logic 1 signal is applied to the set input, the flip-flop is triggered to its set condition (if it isn't already in that condition) in which output Q becomes logic 1 and output $\overline{Q}$ becomes logic 0. On the other hand, when logic 1 is imposed on the reset input, the flip-flop is actuated to its reset condition (if it isn't already there) wherein output Q becomes logic 0 and output $\overline{Q}$ becomes logic 1. The logic 1 signal produced by NAND gate 44 during power-up therefore resets flip-flop 46 and produces logic 0 at its Q output and logic 1 at its $\overline{Q}$ output. The upper input of NAND gate 45 thus becomes logic 0.

The middle and upper inputs of gate 45 will thus be logic 0 and this results in the development of a logic 1 output which in turn is converted to a logic 0 signal by inverter 47. With the cathode of diode 48 at ground potential, the diode conducts through resistor 49 and the junction of the diode and resistor will be essentially at ground potential. As a result, LED (light-emitting diode) 51 will not energize and no gate current flows between the gate terminal G and main terminal $T_1$ of triac 52. The triac thus is non-conductive or off and contactor coil 53 will not be energized. Main contactor 15, which is controlled by contactor coil 53, will consequently remain in its normally-open position thereby interrupting the coupling between AC power supply 10 and pump motor 16 to maintain the motor de-energized. Since the condition of LED 51 indicates whether motor 16 is in its run condition, the LED is appropriately called the "Run Lamp".

In the OFF position of the control system, Automatic Restart switch 55 will be open and this effects the application of logic 1 to the input of inverter 56 which in turn applies logic 0 to the right input of NAND gate 57. Logic 1 is thus produced at the output of gate 57 and that signal is converted by inverter 58 to a logic 0 for application to the $K_B$ input of restart timer 59 which takes the form of a programmable or presettable divide-by-N counter, preferably of the integrated circuit type CD4059. The purpose of restart timer 59 will be explained hereinafter. Suffice it to say at this juncture that a CD4059 divide-by-N counter can be programmed to divide periodically recurring pulses applied to its clock or C input by any number N from 3 to 15,999. The counting ratio is preset by applying V+ to selected ones of a series of jam inputs. Presetting is achieved by the operator by adjusting the complementary binary coded decimal switches 62 and 63. By initially dividing the 60 hertz clock pulses on the clock bus by 360 in counter 61, the clock input of timer 59 will receive one pulse every six seconds or 10 pulses per minute. With such relatively slow input pulses, it is possible to preset the divide-by-N counter to establish an adjustable time delay of up to 16½ hours. When logic 0 is applied to input $K_B$, as is the case when the digital logic control system is OFF, the presettable counter is locked or held in its reset condition and is prevented from counting down from the number preset on its jam inputs. As long as input $K_B$ is logic 0, the output or O terminal of timer 59 will be logic 0. When timer 59 is permitted to count down, as will be described later, it will divide the 10 pulses per minute input pulses by the number set up on its jam inputs. Upon completion of the count down and as mentioned this may take as long as 16½ hours, logic 1 is produced at output O.

The logic 0 produced at the output of inverter 56, when the control system is in its OFF condition, is also applied to the upper input of NAND gate 65 which, in response thereto, produces a logic 1 signal for application to inverter 66 where it is converted to logic 0. Diode 67 thus conducts through resistor 68 to establish the junction of those two components at essentially ground potential. This prevents energization of LED (light-emitting diode) 69 and prevents the flow of gate current through triac 71, with the result that alarm 72 remains de-energized. Alarm 72, the purpose of which will be described later, may take a variety of different forms such as a siren, ringer, bell, buzzer, etc.

Shutdown delay timer 73 also takes the form of a presettable or programmable divide-by-N counter and, like timer 59, is preferably of the integrated circuit type CD4059. Timer 73 is employed to introduce an adjustable time delay no greater than 165 seconds. The specific delay established is determined by setting up a number on the jam inputs (not shown) of the timer. This is done by the placement of jumpers between the voltage source V+ and selected ones of the jam inputs. When timer 73 is activated, namely allowed to count, it divides the 60 hertz clock pulses, applied to its clock input, by the number preset on its jam inputs. When the control system is in the OFF condition, the logic 1 signal appearing at the output of NAND gate 45 insures that timer 73 will be held in its reset condition and will not count. To explain, the logic 1 output of gate 45 is inverted by inverter 74 to a logic 0 signal for application to the lower input of NAND gate 75. A logic 1 output is thus produced which is inverted in inverter 76 to a logic 0 for application to the $K_B$ input of timer 73. With $K_B$ established at logic 0, timer 73 is held in its reset state and counting is prohibited.

Circuit 77 is another D flip-flop which preferably takes the form of integrated circuit type CD4013. During power-up when DC power supply 13 is energized and DC voltage V+ is developed, flip-flop 77 is automatically triggered to its set condition in which its Q output is logic 1. To elucidate, in the absence of voltage V+ the input of inverter 78 will be zero volts or logic 0. At the instant that voltage V+ is produced by DC power supply 23, logic 0 still appears at the input of inverter 78 so it is converted by the inverter to logic 1 for application to the set input of flip-flop 77. Such an applied signal triggers the flip-flop to its set ($Q = 1$) condition. Capacitor 79 is provided to insure that logic 0 remains at the input of inverter 78 long enough to apply a logic 1 set pulse to the flip-flop. In other words, at the instant voltage V+ appears at the lower terminal of resistor 80, the ungrounded terminal of capacitor 79 will be at zero volts. The capacitor will then charge through resistor 80 toward voltage V+ and, depending on the time constant of the RC combination, this will require a time interval sufficiently long to permit flip-flop 77 to receive a logic 1 set pulse, or what is commonly called a "set strobe". Of course, after capacitor 79 is charged to voltage V+, the output of inverter 78 will be logic 0 but that potential will not trigger the flip-flop.

At the same time or shortly after flip-flop 77 receives a set strobe, a logic 1 signal will be applied to the data or D input of the flip-flop. More particularly, with the digital logic control system in its OFF condition and with main contactor 15 open, no current flows through line conductors $L_A$, $L_B$ and $L_C$ and no signals are produced by current transformer windings 81, 82 and 83. As a consequence, no signals are applied to the primary windings of transformers 85, 86 and 87 and no DC voltages are produced by full wave rectifiers 85a, 86a and 87a. Hence, zero voltage will be applied to the negative input of each of the twelve voltage comparators 88 – 99. Since the positive input of each of those comparators is set a positive potential level by voltage divider 101, each comparator will provide a logic 1 output. Circuits 102 – 109 are D type flip-flops and each serves as a counter in a manner to be described. As in the case with the other D flip-flops employed, each of flip-flops 102 – 109 preferably is of the type CD4013. Circuits 111 and 112 also function as counters and comprise presettable divide-by-N counters, preferably of integrated circuit type CD4018.

With logic 1 applied to each of the four inputs of NAND gate 113, a logic 0 is obtained at the gate's output and this is converted by inverter 114 to a logic 1 signal for application to the reset inputs of the ten counters 102 – 112. Each counter will thus be held in its reset state, wherein $O = 0$, and upper input of each of NAND gates 115–118 outputs will receive a logic 0 signal. In the meantime, the logic 1 outputs of comparators 88 –99 are converted by inverters 121 – 124 to logic 0 signals for application to the lower inputs of the four gates 115 – 118. Since all of the inputs of gates 115 – 118 will be at logic 0, each of those gates will provide a logic 1 output for delivery to NAND gate 125. This results in a logic 0 output from gate 125 which is then inverted by inverter 126 to a logic 1 potential for application to the upper input of NAND gate 127.

As described previously, the set strobe applied to flip-flop 77 during power-up establishes that circuit in its set condition wherein output Q is at logic 1. The lower input of NAND gate 127 is directly tied to output Q. Hence, both inputs of the gate will be at logic 1 and this results in a logic 0 output which is inverted by inverter 128 to a logic 1 signal for application to the D input of flip-flop 77. As is characteristic of D type flip-flops, the logic level present at the D input is transferred to the Q output during the positive-going transition of the next occurring clock pulse. Of course, since flip-flop 77 is already in its set condition, the logic 1 signal at the D input will not effect triggering of the flip-flop. However, it will effectively hold or lock the flip-flop in its set condition.

The logic 1 output of flip-flop 77 is also applied to inverter 131 where it is changed to a logic 0 signal for application to the cathode of diode 132. The diode therefore conducts through resistor 133 and the junction of those two components will be established at essentially ground potential. LED (light-emitting diode) 135 therefore will not energize and no gate current will flow through triac 136. With the triac in its nonconductive or OFF condition, alarm 137 will be de-energized. As in the case of alarm 72, alarm 137 may take any suitable form, such as a siren, ringer, bell, buzzer, etc.

Circuit 139, the purpose of which will be explained hereinafter, constitutes a J-K flip-flop preferably of integrated circuit type CD4027. In such a flip-flop, when logic 1 is applied to its J input at the same time as the positive-going transition of a clock pulse, the flip-flop will be triggered to its set condition in which its Q output will be logic 1. Simultaneously, of course, output $\bar{Q}$ will be logic 0. On the other hand, when logic 1 is impressed on the K input concurrently with a rising clock pulse, the J-K flip-flop assumes its reset condition in which output Q is logic 0 and output $\bar{Q}$ is logic 1. As in the case of the D type flip-flops, a logic 1 at its set input establishes a J-K flip-flop in its set condition independent of a clock pulse, and a logic 1 at its reset input trips the J-K flip-flop to its reset state independent of a clock pulse. Also like a D flip-flop, the set and reset inputs of a J-K flip-flop must both be at logic 0 in order for the flip-flop to respond to input conditions at its J and K inputs.

The reset input of flip-flop 139 is permanently grounded (logic 0) but the set input is coupled to an arrangement which produces a set strobe during power-up when DC power supply 23 is energized and voltage V+ develops. At the instant that voltage V+ appears, the input of inverter 141 will still be at logic 0 and this will be immediately inverted by the inverter to provide a logic 1 set pulse or set strobe for establishing flip-flop 139 in its set condition. Capacitor 142 insures that the input of inverter 141 remains at logic 0 long enough to allow flip-flop 139 to set. When the capacitor charges up to voltage V+, logic 1 will be applied to inverter 141 and this results in a logic 0 at the set input of the flip-flop. Hence at power-up flip-flop 139 will be set by a set strobe, but then immediately thereafter the set input is automatically established at logic 0 to permit the flip-flop to respond to input conditions at its J and K inputs.

The logic 1 at output Q of flip-flop 139 is converted by inverter 144 to logic 0 for application to the cathode of diode 145. The diode thus conducts through resistor 146, thereby establishing the junction of the resistor and diode essentially at ground potential. This prevents energization and illumination of LED (light-emitting diode) 147. Concurrently, the $\bar{Q}$ output of J-K flip-flop 139 will be logic 0 and this signal is applied to the reset input of flip-flop 77. Of course, such a signal will have no effect on the flip-flop.

Assume now that it is desired to energize pump motor 16 and effect rotation thereof. Initially, ON-OFF switch 42 must be actuated by the operator to its closed or ON position and this changes the input of inverter 41 from logic 1 to logic 0. Logic 1 thus appears at the output of the inverter and is applied to the right input of NAND gate 44. Since flip-flop 77 will be in its set condition at this time, the left input of gate 44 will also be logic 1, with the result that logic 0 will be supplied from the output of gate 44 to the reset input of flip-flop 46. Start switch 151, which is of the momentary contact type, must now be momentarily closed to apply logic 0 to the upper input of NAND gate 152. This produces a logic 1 at the output of the gate which is imposed on the set input of flip-flop 46 to establish the circuit in its set condition wherein output Q is logic 1. This output signal is fed back to the upper input of NAND gate 153. The lower input of the gate has already been established at logic 1 by virtue of the logic 0 at the output of timer 73 which is inverted by inverter 154. Hence, with logic 1 at both inputs of gate 153, a logic 0 output will be applied to inverter 156 where it is converted to logic 1 for application to the data input of flip-flop 46. As mentioned, the logic level present at the D input is transferred to the Q output during the positive-going excursion of the next clock pulse. Thus, flip-flop 46 will be held or locked in its set ($Q = 1$) condition.

When Start switch 151 is released by the operator, it springs back to its open position shown in the drawing and the upper input of gate 152 is established at logic 1. At this time, the lower input of the gate will also have a logic 1 potential impressed thereon. To explain, normally-closed Auxiliary switch 158, the purpose of which will be described, applies logic 0 to inverter 159 which in turn inverts that signal to apply a logic 1 to the upper input of NAND gate 161. Since PHD switch 160, the purpose of which will be explained later, is normally open, the lower input of gate 161 will also be established at logic 1. The gate's output will thus be logic 0 and this is inverted by inverter 162 to logic 1 for application to the upper input of NAND gate 165. As mentioned previously, the output of timer 59, which is applied to the lower input of gate 165, will be logic 0 at this time. With those input conditions, gate 165 produces a logic 1 for delivery to the lower input of gate 152. Since each of its inputs is at logic 1, gate 152 produces a logic 0 potential for application to the set input of flip-flop 46. With logic 0 now at both the set and reset inputs of flip-flop 46, that circuit will be allowed to respond to input conditions on its D or data input.

With each of flip-flops 46 and 77 in its set ($Q = 1$) condition and with inverter 41 producing a logic 1 output, all three inputs of NAND gate 45 will receive logic 1 signals, and this results in a logic 0 output potential for application to inverter 47. The cathode of diode 48 will thus be at essentially the logic 1 level or voltage V+ with the result that the plate of LED 51 will be sufficiently positive to effect current flow through the LED and between the gate terminal and main terminal $T_1$ of triac 52, causing LED 51 to illuminate and triac 52 to turn ON. Capacitor 167, and the corresponding capacitors connected to the gates of the other triacs, holds the gate voltage steady or constant in order that once a triac is turned ON it is not turned OFF by noise signals.

With triac 52 switched ON, a very low inpedance is presented between main terminals $T_1$ and $T_2$. Hence, the full 120 volts AC voltage developed across secondary winding 21 will be applied across contactor coil 53 to effect energization thereof and resultant closing of main contactor 15. Three-phase power supply 10 will now be coupled to a submersible pump motor 16 and the motor will begin to rotate. The illuminated LED 51 provides a visual signal to the operator that the motor has been energized and is in its run condition. The direction of rotation of the motor is such that the starting and running torque will tighten all threaded joints in the pumping unit and tubing. It will be recalled that pump motor 16 may exceed 200 horsepower and will be designed to function at the bottom of oil wells having an average depth of 9,000 feet.

During start-up of motor 16 and while it is accelerating up to normal running or operating speed, an underload or undercurrent condition may exist, but such a condition will not cause the underload protection system to shut the motor down. As will be seen when the underload protection arrangement is described, an underload condition establishes terminal $K_B$ OF timer 73 at logic 1, whereupon the timer begins to count down from its present state. In other words, it begins to divide the 60 hertz clock pulses by the number set up on its jam inputs. While timer 73 is counting down, its output terminal remains at logic 0 so that flip-flop 46 remains latched in its set condition and motor 16 continues to accelerate. Long before timer 73 completes the count, however, which may take up to 165 seconds depending on the adjustment of the timer as mentioned, the motor will reach normal operating speed and the underload condition will disappear. Input $K_B$ of the timer 73 therefore changes from logic 1 to logic 0 and this resets the timer to its preset state.

Underload protection is obtained by monitoring or sensing the three phase currents drawn by pump motor 16 from power supply 10. This is achieved by current transformer windings 81, 82 and 83 which apply to the primary windings of transformers 85, 86 and 87, respectively, AC voltages whose magnitudes are directly proportional to the phase currents A, B and C respectively. These AC voltages are rectified by rectifiers 85a, 86a and 87a and filtered by filters 167, 168 and 169 to provide on conductors 171, 172 and 173 positive DC voltages having amplitudes proportional to the phase currents. The parameters and the transformer turns ratios are selected so that during normal operation, when the amplitude level of each phase current falls within a present normal amplitude range, the postive DC voltages on conductors 171, 172 and 173 will be substantially less than +12 volts or voltage V+. Zener diodes 174, 175 and 176 serve as clamps so that the voltages on conductors 171, 172 and 173 can never exceed 13 volts regardless of the amplitude of the phase currents flowing through conductors $L_A$, $L_B$ and $L_C$.

Under normal conditions when the phase currents lie within the normal amplitude range, the positive DC voltage on conductor 171, which is applied to the positive input of voltage comparator 177, will be of greater magnitude than the positive DC voltage applied to the comparator's negative input from potentiometer 180, which is adjusted by the operator to establish the low set point in the control system. Likewise, the positive DC voltage on conductor 172, applied to the positive input of comparator 178, will be of greater amplitude than the voltage on the comparator's negative input, and the positive DC voltage on the positive input of comparator 179 will be of greater magnitude than the voltage impressed on the comparator's negative input. As a result, under normal conditions each of comparators 177, 178 and 179 provides a logic 1 output which is applied to the lower input of NAND gate 181. At that time, as mentioned previously, the other two inputs of gate 181 will also be at logic 1 so a logic 0 is supplied to the upper input of NAND gate 75. In the meantime, the logic 0 at the output of NAND gate 45 results in a logic 1 signal for application to the lower input of gate 75. The resulting logic 1 at the output of gate 75 manifests in a logic 0 for application to the $K_B$ input of timer 73. Hence, under normal conditions and with no underload, timer 73 is held in its reset condition by the application of logic 0 to its terminal $K_B$.

Assume now that after pump motor 16 has been operating normally for some time and oil has been pumped out of the well, a true underload condition develops, as distinguished from a false underload condition resulting from a transitory, momentary or fluctuating condition. As explained, a true underload could occur when the oil well is pumped dry, a condition known as "pump-off". When that happens, it is important to automatically shut the pump motor down in order to protect the motor against damage that it may otherwise suffer.

Potentiometer 180 is adjusted so that the voltage level at the negative inputs of comparators 177, 178 and 179 will equal the voltage appearing at the positive inputs when each of the phase currents equals the lower limit (low set point) of the preset normal amplitude range. In this way, whenever any of the phase currents in conductors $L_A$, $L_B$ and $L_C$ falls below the normal amplitude range, one of comparators 177, 178 and 179 will be triggered to its operating state in which logic 0 is produced at its output terminal. When this occurs, the lower input of gate 181 becomes logic 0 and the output of that gate changes to logic 1. With both inputs of gate 75 now at logic 1, logic 0 will be delivered to inverter 76 to produce a logic 1 signal for application to terminal $K_B$ of timer 73. This releases the timer from its preset starting state and it begins counting the 60 hertz clock pulses as it counts down toward its final state, which as mentioned may take as long as 165 seconds depending on the jumper placement on the jam inputs. The time interval selected will be determined by the enviromental conditions in which the pump and motor assembly operate.

Since there is a true underload, the magnitude of at least one of the phase currents will still be below the normal amplitude range when timer 73 counts down or advances to its final state, at which time the output of the timer becomes logic 1. The lower input of gate 153 therefore changes to logic 0 and the output of that gate becomes logic 1. After inversion in inverter 156, the signal manifests as logic 0 for application to the D input of flip-flop 46. During the positive-going excursion of the next clock pulse, the flip-flop triggers to its reset condition in which output Q equals logic 0. The output signal is fed back to the upper input of gate 153 to hold flip-flop 46 in its reset condition. The logic 0 output of the flip-flop is also applied to the L/PE terminal of timer 73 to allow the output of the timer to return to logic 0.

With flip-flop 46 in its reset condition, the upper input of gate 45 will be established at logic 0, as a consequence of which the output of that gate becomes logic 1 and this turns triac 52 OFF and de-energizes LED 51. With contactor coil 53 now de-energized, main contactor 15 opens thereby interrupting the coupling circuitry that connects pump motor 16 to power supply 10. As a result, motor 16 de-energizes and stops rotating.

After the motor is shutdown in response to an underload condition, it may be restarted by the operator merely by manually depressing or closing momentary Start switch 151 which sets flip-flop 46 and effects energization of contactor coil 53.

The digital logic control system also includes an automatic restarting arrangement that automatically reconnects power supply 10 to pump motor 16 after it has been shutdown as the result of an underload condition and after a certain time delay interval has elapsed. Since an underload shutdown usually occurs as a consequence of "pump-off", oftentimes it is desired to delay restarting for several hours to permit oil to flow back into the well. In addition, it is also important in many applications to delay re-energization of the pump motor for a relatively long period in order to prevent damage to the motor-pump assembly or to one of the interconnecting shafts. To explain, at the instant of shutdown a vertical column of fluid several thousand feet high will exist in the oil well. The fluid will then try to drain back down to the static level of the well. Usually, check valves and other devices are included to hold the fluid, but they may become faulty and malfunction. When that occurs, the draining fluid acts as a reverse turbine and spins the motor-pump assembly in the opposite direction. If an attempt is made to restart the pump when it is rotating in the wrong direction, quite often the pump will be damaged or a shaft will break. Hence, a backspin time delay is ordinarily desired. In the present application, provision is made to delay automatic restart for an adjustable time period that may be as long as 16½ hours.

To establish the control system in its automatic restart mode, the operator must close Automatic Restart switch 55 which continuously maintains the input of inverter 56 at ground potential or logic zero. The upper input of gate 65 thus receives a logic 1 signal from the output of inverter 56. Since the motor is shutdown due to an underload condition, flip-flop 46 will be in its reset ($Q = 0$) condition and logic 1 will be fed to the lower input of gate 65 from output $\overline{Q}$ of the flip-flop. With both inputs of gate 65 at logic 1, a logic 0 output is supplied to inverter 66 where it is converted to logic 1 for application to the cathode of diode 67. The junction of resistor 68 and diode 67 thus assumes a potential sufficiently positive to energize LED 69 and effect gate current flow between terminals G and $T_1$ of triac 71, thereby turning the triac ON to apply 120 volts AC to alarm 72. Lamp 69 and 72 provide visual and audible signals to the operator to indicate that motor 16 is shutdown and that the control system is in its automatic restart mode.

At the same time, the logic 1 output from inverter 56 is also applied to the right input of gate 57. Since the middle input of that gate will also be at logic 1 and since the left input of the gate will also be at logic 1, a logic 0 will be fed to inverter 58 where it is converted to logic 1 for application to terminal $K_B$ of restart timer 59. As soon as input $K_B$ becomes logic 1, timer 59 releases from its reset condition and begins to count down from its preset state. More specifically, it divides the pulses received at its clock input by the number set up on its jam inputs. By supplying the pulses at the rate of one pulse every six seconds or ten pulses per minute, timer 59 will require up to 16½ hours (depending on the setting of the jam inputs) to count down completely from its preset state. When the full count occurs, a logic 1 is produced at the output of the timer and is applied to the lower input of gate 165.

As mentioned previously, with auxiliary switch 158 closed the upper input of gate 165 will also be at logic 1. Thus, logic 0 is impressed on the lower input of gate 152, thereby applying logic 1 to the set input of flip-flop 46. In this way, the output of timer 59, when the full count is reached, has the same effect on flip-flop 46 as manually closing momentary switch 151. Flip-flop 46 therefore assumes its set ($Q = 1$) condition and contactor coil 53 is energized to reconnect motor 16 to power supply 10. When flip-flop 46 actuates to its set condition, output $\overline{Q}$ becomes logic 0 and this results in extinguishing LED 69 and turning OFF alarm 72. Since the output of gate 161 will be logic 0 at this time, input L/PE of timer 59 will be logic 0 and this permits the output of the timer to return to logic 0. This changes the set input of flip-flop 46 to logic 0 so that the flip-flop can respond to input conditions on its data input. Input $K_B$ of timer 59 also returns to logic 0 when the flip-flop assumes its set condition.

Consideration will now be given to the operation of the overload protection arrangement which interrupts the coupling between power supply 10 and pump motor 16 anytime the amplitude level of at least one of the phase currents exceeds the present normal amplitude range and remains there for a given time delay interval. Four different delay times are provided in order that the actual shutdown delay selected will be inversely related to the amount of overload. In this way, greater overloads create quicker shutdowns. More particularly, it is to be noted that each of the three positive DC voltages on conductors 171, 172 and 173 (which voltages are directly proportional to the three phase currents) is applied to four different ones of the twelve voltage comparators 88 – 99. Note also that four different positive DC voltage levels (called standard voltages) are derived from voltage divider 101 for application to those comparators. Of course, by adjusting potentiometer 101a all four standard voltages are changed. As will be appreciated, the position of the potentiometer establishes the high or overload set point in the control system, and the four standard voltages respectively represent different degrees of overload. The twelve comparators are divided into four groups of three comparators per group, with each of the three comparators in each group receiving on its negative input a respective one of the DC voltages on conductors 171, 172 and 173. Each comparator in a group receives, on its positive input, the same standard voltage from divider 101, with each of the four groups receiving a different respective one of the four voltages from the divider. Each of the four groups compares the phase currents with a respective one of the four standard voltages to detect a respective one of four overload conditions.

Preferably, potentiometer 101a will be adjusted by the operator so that an overload condition of approximately 15% above nameplate motor current (the current at which the pump motor is designed to operate) will be the smallest detected. For convenience, this overload set point of 15% above nameplate current will be called "one times overload." When so adjusted, the other three overload conditions will be 1.66, 2.33 and 3.00 times overload, as indicated in the characteristic curve of FIG. 5 which plots the shutdown time delay versus overload. To explain, when the potentiometer is positioned as contemplated, if the current in at least one of line conductors $L_A$, $L_B$ and $L_C$ is of a magnitude which is equal to the upper limit of the normal amplitude range (namely, one times overload), the positive DC voltage at the negative input of at least one of comparators 97, 98 and 99 will be greater than the voltage at the comparator's positive input, as a result of which the common output of those comparators will be logic 0. The magnitude of the standard voltage derived from divider 101 and applied to the positive inputs of comparators 94, 95 and 96 is such that those comparators will produce a logic 0 output in the presence of a 1.66 times overload condition.

An appropriately higher potential is supplied from divider 101 to the positive inputs of comparators 91, 92 and 93 in order that the negative inputs of those comparators will receive voltages greater than that at their positive inputs, thereby producing logic 0 output, in the presence of a 2.33 times overload condition. A still higher standard voltage from divider 101 is applied to the positive inputs of comparators 88, 89 and 90 so that the voltages on their negative inputs will not exceed that on their positive inputs until a 3.00 times overload condition is reached.

As mentioned previously, under normal conditions logic 1 will be applied to the reset inputs of flip-flops 102 - 109 and counters 111 and 112 to hold each of those circuits in its reset state. Assume now that the phase current flowing through at least one of line conductors $L_A$, $L_B$ and $L_C$ indicates a one times overload condition, namely 15% above the nameplate motor current. In that case, at least one of comparators 97, 98 and 99 will provide a logic 0 output and this changes the output of gate 113 to logic 1 which is then converted by inverter 114 to logic 0 for application to the reset inputs of circuits 102 - 112. This releases those circuits so that counting is permitted. Counters 111 and 112 are presettable divide-by-N counters, as mentioned previously, and preferably adjusted so that one pulse is developed at the $\overline{Q}$ output of counter 112 for every 60 clock pulses supplied to the clock input of counter 111. Preferably, the 60:1 count division is achieved by adjusting counter 111 to produce one output pulse for every six input pulses, and by adjusting counter 112 to produce one output pulse for every ten pulses applied to its clock input.

Hence, one full second after the system goes into its one times overload condition, a pulse is applied to the clock input of flip-flop 102, and since the data or D input of that flip-flop is established at voltage V+ or logic 1, the effect of the clock pulse is to trigger the flip-flop to its set condition in which its Q output, which connects to the upper input of gate 115, becomes logic 1. However, since the system is only one times overloaded, the lower input of gate 115 will still be at logic 0 and the output of that gate will remain at logic 1.

Flip-flops 103 and 104 are interconnected in well known manner to provide a 4:1 counter. Since it is driven by the output pulses from counter 112, a pulse will be produced at output $\overline{Q}$ of flip-flop 104 four seconds after the overload condition is detected. Flip-flop 105 is actuated by that pulse to its set condition thereby providing logic 1 at its Q output. The output of gate 116 will not change, however, since its lower input will still be logic 0. The output pulses from flip-flop 104 are also applied to flip-flop 106 which serves as a 2:1 divider, thereby producing a pulse at its $\overline{Q}$ output eight seconds after the underload condition is detected. Flip-flop 107 therefore is triggered to its set condition and a logic 1 signal is delivered to the upper input of gate 117. As in the case of gates 115 and 116, however, the output of gate 117 does not change at this time inasmuch as its lower input terminal is still receiving a logic 0 signal from inverter 123.

Flip-flop 108 also functions as a 2:1 counter and since it is driven by the output pulses from flip-flop 106, a pulse will be supplied to the clock input of flip-flop 109 sixteen seconds after the system goes into the overload condition. Flip-flop 109 sets at that time and supplies a logic 1 signal to the upper input of gate 118. The output of this gate will now change since its lower input receives a logic 1 signal from inverter 124. A logic 0 signal will now be applied to the lower input of gate 125 and a logic 1 thus develops at the output of that gate. It is then converted by inverter 126 to a logic 0 signal which constitutes an overload control signal indicating that an overload condition exists. Note that the development at at the output of inverter 126 of the logic 0 control signal is not produced until the system has been in that one times overload condition for sixteen full seconds. This insures that any fluctuations in the phase currents that cause a one times overload, and this may occur during start-up, have to last for at least sixteen seconds before the overload control signal develops. In this way, transient effects will not shut the motor down. The presence of an overload control signal, at the output of inverter 126, thus indicates that an overload condition exists and the timing of that signal indicates the degree of the overload condition.

The overload control signal (logic 0) from inverter 126 is applied to the upper input of gate 127, whereupon a logic 1 develops at the output of the gate and is converted by inverter 128 to a logic 0 signal for application to the data input of flip-flop 77. On the occurrence of the next clock pulse, the flip-flop is actuated to its reset condition in which its Q output becomes logic 0. The lower input of gate 45 thus becomes logic 0 and this results in logic 1 being applied to inverter 47 which in turn causes deenergization of LED 51 and contactor coil 53. Pump motor 16 therefore shuts down. The logic 0 output from flip-flop 77 is fed back to the lower input of gate 127 in order to hold the data input of the flip-flop at logic 0, thereby latching the flip-flop in its reset condition even after the motor stops rotating and the overload condition disappears.

The logic 0 output from flip-flop 77 is also applied to the left input of gate 44 to produce a logic 1 at the reset input of flip-flop 46, as a consequence of which the flip-flop latches in its reset ($Q = 0$) condition. Inverter 131 also receives a logic 0 signal from flip-flop 77 and this causes the junction of diode 132 and resistor 133 to be sufficiently positive to energize LED 135 and to turn ON triac 136, whereupon alarm 137 provides an audible signal indicating that the system has been shut down due to an overload condition. Of course, the illuminated LED 135 provides a visual signal to the operator.

The left input of gate 57 is also established at logic 0 during an overload shutdown, which insures the input $K_B$ of timer 59 remains at logic 0 so that counting is prohibited.

After an overload shutdown, the condition causing the overload must, of course, be corrected so that pump motor 16 may be re-energized. When the condition has been remedied, manual restarting is necessary. This is achieved by closing momentary Overload Reset switch 183 which effects the application of a logic 1 signal to the set input of flip-flop 77, whereupon the flip-flop actuates to its set ($Q = 1$) condition. When switch 183 is released by the operator, it springs back to its open position shown in the drawing and causes the set input of flip-flop 77 to return to a logic 0 potential so that the flip-flop may respond to input conditions. The operator must also depress momentary switch 151 to actuate flip-flop 46 to its set ($Q = 1$) condition. With flip-flops 46 and 77 in their set conditions, LED 51 illuminates and contactor coil 53 energizes, thereby reconnecting pump motor 16 to power supply 10. In addition, overload LED 135 de-energizes and alarm 137 turns OFF.

Assuming now that the system experiences a 1.66 times overload condition, at least one of comparators 94, 95 and 96 produces a logic 0 which manifests at the lower input of gate 117 as logic 1. Eight seconds after that overload occurs, a logic 1 signal arrives at the upper input of gate 117, whereupon a logic 0 output is supplied to gate 125. As a result, a logic 0 control signal develops at the output of inverter 126 eight seconds after the 1.66 times overload condition is detected, and this control signal effects shutdown of pump motor 16. In similar fashion, in the presence of a 2.33 times overload condition at least one of comparators 91, 92 and 93 produces a logic 0 signal which is converted by inverter 122 to a logic 1 signal for application to the lower input of gate 116. Four seconds after the overload condition is detected, flip-flop 105 applies logic 1 to the upper input of gate 116, and a logic 0 output will be supplied to gate 125. A logic 0 overload control signal thus emerges at the output of inverter 126 and causes motor shutdown.

Finally, when a 3.00 times overload condition occurs, at least one of comparators 88, 89 and 90 produces a logic 0 output which causes a logic 1 to be applied on the lower input of gate 115. One second after the overload condition occurs, logic 1 is applied to the upper input of gate 115 and this results in a logic 0 output and a resultant logic 0 control pulse at the output of inverter 126 which shuts the motor down.

It is to be noted that by depressing and holding switches 151 and 183 the pump motor will be energized even though the system may be substantially overloaded. This may be necessary, for example, to unstick a stuck motor.

Hence, the overload protection arrangement decouples AC power supply 10 from pump motor 16 when the amplitude level of any of the phase currents exceeds the preset normal amplitude range for a time interval of a duration inversely proportional to the extent of the overload condition such that the greater the overload, the faster the shutdown of the pump motor. Of course, quicker shutdowns are desired for greater overloads to avoid damage to the equipment.

As mentioned previously, normally-closed auxiliary switch 158 may serve a variety of different purposes; for example, it may constitute a float switch that opens when a retaining tank is filled. Under those circumstances, the input of inverter 159 will be established at logic 1 thereby applying logic 0 to the upper input of gate 181. This results in the application of a logic 1 signal to input $K_B$ of timer 73 to cause the timer to count down from its preset state. When the full count occurs, logic 1 is produced at the timer's output and this causes shutdown of motor 16 as described.

The normally-open PHD switch 160 is controlled by and is responsive to the downhole temperature and pressure at the pumping unit. If they become excessive, switch 160 closes and imposes logic 0 on the middle input of gate 181 and this results in shutdown of motor 16.

If Automatic Restart switch 55 is closed and the system goes into its automatic restarting mode after a shutdown due to either an opening of switch 158 or a closing of switch 160, motor re-energization is prevented until switch 158 is closed and switch 160 is opened. To explain, when flip-flop 46 is reset by the output of timer 73, restart timer 59 begins to count down from its present state. After the count down is completed, logic 1 is produced at the timer's output and applied to the lower input of gate 165. If switch 158 is closed and switch 160 is opened at this time, the upper input of gate 165 will be at logic 1 and this results in acutation of flip-flop 46 to its set ($Q = 1$) condition, whereupon motor 16 energizes. On the other hand, if switch 158 is still opened or if switch 160 is still closed, one of the inputs of gate 161 will be logic 0 which causes the upper input of gate 165 to be at logic 0. As a consequence, the output of gate 165 will be logic 1, so flip-flop 46 will not be set. The logic 1 output of gate 161 is also applied to the L/PE input of timer 59 to hold the output of the timer at logic 1 until switch 158 opens and switch 160 closes. When those switches return to their normal positions, both inputs of gate 165 will be logic 1 and this causes a logic 1 output from gate 152 which sets flip-flop 46.

Attention is now directed to the phase sequence detection arrangement which effects motor shutdown if a phase reversal occurs on the incoming power lines. The explanation of the operation of the phase sequence detector will be aided by the signal waveforms in FIG. 4. The phase A alternating current, which varies in sinusoidal fashion, flowing through line conductor $L_A$ produces an alternating voltage across the secondary winding of transformer 85. Similarly, the phase B and C alternating currents in conductors $L_B$ and $L_C$ produce alternating voltages across the secondaries of windings 86 and 87 respectively. These three alternating voltages (labeled $\phi A$, $\phi B$ and $\phi C$) are shown in FIG. 4 and, of course, are phase-displaced with respect to each other by 120°. It will be assumed that the correct phase sequence is ABC, namely phase A ($\phi A$) leads phase B by 120° and phase B ($\phi B$) in turn leads phase C ($\phi C$) by 120°. Each of voltage comparators 184, 185 and 186 effectively converts a respective one of the three sinusoidal phase voltages of FIG. 4 to a series of pulses occurring in time coincidence with the positive half cycles of the phase voltage. In other words, each positive half cycle is changed to a square wave pulse.

To explain, due to the presence of diode 187, only the positive half cycles of phase voltage A will be applied to the positive input of comparator 184. Meanwhile, the positive DC voltage on conductor 171 is divided down to a relatively small voltage for application to the negative input of comparator 184. The parameters are selected so that during each positive half cycle of the phase A voltage the positive input of comparator 184 will be greater than or positive with respect to the negative input of the comparator. Hence, during each positive half cycle the output of comparator 184 will provide a logic 1 potential, the intervening intervals providing a logic 0 output as shown by waveform A in FIG. 4. Comparators 185 and 186 respond in similar fashion to the phase B and phase C voltages respectively to produce at their outputs the signals of waveforms B and C respectively.

Considering only inputs J, C and K of J-K flip-flop 138, changes in operating state of that flip-flop occur only during the positive-going transitions of the pulses applied to its C or clock input. If input J is at logic 1 and input K at logic 0 during the positive-going excursion of a pulse applied to the clock input, the flip-flop sets with its Q output being logic 1 and its $\overline{Q}$ output being logic 0. On the other hand, if input J is logic 0 and input K is logic 1 during the positivegoing transition of a clock pulse, the flip flop actuates to its reset condition in which its Q output will be logic 0 while its $\overline{Q}$ output is logic 1.

Thus, when the phase sequence is correct and the signals of waveforms A, B and C are applied to the J, C and K inputs respectively, flip-flop 139 will be actuated to its set ($Q = 1$) condition and will remain there. This occurs since the J input (waveform A) will be at logic 1 every time the signal of waveform B, which is applied to the clock input, undergoes a positive amplitude change. The logic 1 portions of waveform C (applied to input K) will have no effect since they are not accompanied by a positive-going transition of the signal of waveform B.

As a result, when power supply 10 is correctly interconnected to pump motor 16 and the three phase currents supplied thereto have the correct sequence, output Q of flip-flop 139 will be logic 1 and LED 147 will remain de-energized, thereby visually indicating to the operator that a proper phase sequence exists. At the same time, logic 0 will appear at the $\overline{Q}$ output of the flip-flop and will be applied to the reset input of flip-flop 77. This signal, of course, will have no effect on the flip-flop.

Of course, a proper phase sequence is necessary in order that motor 16 rotate in the right direction. That direction, as mentioned, will be such that the starting and running torque will tighten all threaded joints in the pumping unit and interconnecting tubing. If the phase sequence is wrong, pump motor 16 will run in reverse and will tend to unscrew the fittings. Pumping of oil at a considerably reduced rate may still occur since usually the pumps are of the centrifugal type which will pump in either rotational direction. It is thus important to shut the motor down immediately and signal the operator in the presence of a phase reversal. The desired action will be achieved since any other phase relationship of waveforms A, B and C, other than that shown in FIG. 4, will effect actuation of flip-flop 139 to its reset condition.

To explain, assume that the phase sequence is ACB instead of the correct ABC. In that case, the signals of waveforms B and C effectively interchange with waveform B appearing on input K of flip-flop 139 and waveform C appearing at input C. Each time waveform C undergoes a positive amplitude change, input K will be at logic 1 and this effects actuation of flip-flop 139 to its reset condition wherein Q will be logic 0 and $\overline{Q}$ will be logic 1. LED 147 now energizes and illuminates to provide a visual signal to the operator that an incorrect phase sequence is present, which in turn indicates that power supply 10 is incorrectly connected to load or motor 16. At the same time, flip-flop 77 will be reset, whereupon motor 16 is immediately de-energized. As in the case of an overload shutdown, restarting can be achieved only by actuating Overload Reset switch 183 and start switch 151.

Consider now that the incorrect phase sequence is such that the signals of waveforms A, B, and C are applied to the C, J and K inputs respectively. Under those circumstances, each time the signal (waveform A) applied to the C input undergoes a positive amplitude change, the level at input K (waveform C) will be logic 1 which will maintain flip-flop 139 in its reset (Q = 0) condition, thereby shutting down the pump motor and providing an indication the power supply 10 is incorrectly connected to the motor. The other incorrect sequence would be such that the signals of waveforms A, B and C appear at the K, C and J inputs respectively. Once again, during each of the positive-going pulse transitions of the signal (waveform B) applied to the C input, input K (on which waveform A will be found) will be at logic 1 and flip-flop 139 will be reset, thereby causing shutdown of motor 16.

To summarize the invention, the digital logic phase sequence detector monitors the phase sequence of the three phase currents supplied by power supply 10 to the phase-sensitive load 16 to determine if a predetermined desired phase sequence exists, thereby determining whether the power supply is correctly connected to the load. Flip-flop 139 has set and reset operating states and has first, second and third inputs (J, C and K inputs respectively) for actuating the flip-flop to its two operating states. The flip-flop triggers to its set operating state if a positive-going pulse transition is applied to the second or C input when the first or J input is established at a logic 1 signal level. Moreover, flip-flop 139 actuates to its reset operating state if a positive-going pulse transition is applied to the second or C input when the third or K input is established at a logic 1 signal level. Voltage comparators 184, 185 and 186 produce first, second and third phase-displaced, generally rectangular shaped control or logic signals (waveforms A, B and C respectively) each of which alternates between logic 1 and logic 0 levels and each of which represents and is a function of a respective one of the three phase currents flowing through conductors $L_A$, $L_B$ and $L_C$. When the predetermined desired phase sequence is present, the logic 1 pulse components of the first logic signal (waveform A) embrace or overlap the positive-going transitions of the second logic signal (waveform B) and the logic 1 pulse components of the second logic signal overlap the positive-going transitions of the third logic signal (waveform C). The three logic signals effect actuation of flip-flop 139 to its set operating state if the predetermined desired phase sequence exists. If not, those logic signals effect resetting of flip-flop. LED 147 is controlled by flip-flop 139 and provides an indication of the operating state of the flip-flop.

It is to be particularly noted that with the unique digital logic arrangement of this invention, phase sequence sensing is achieved at relatively low cost, in very little space, with relatively little power, and in a highly efficient and reliable manner.

Certain features described in the present application are disclosed and claimed in the following copending applications filed concurrently herewith: Ser. No. 583,718, filed in the name of David R. Ellis-Anwyl, and Ser. No. 583,717, filed in the name of Joseph E. Vandevier and David R. Ellis-Anwyl, both of which are assigned to the present assignee.

While a particular embodiment of the invention has been shown and described, modifications may be made, and it is intended in the appended claims to cover all such modifications as may fall within the true spirit and scope of the invention.

We claim:

1. A phase sequence detector for monitoring the phase sequence of the three phase currents supplied by a three-phase AC power supply to a phase-sensitive three-phase load to determine if a predetermined desired phase sequence exists, thereby determining whether the power supply is correctly connected to the load, comprising:

a flip-flop having set and reset operating states and having first, second and third inputs for actuating said flip-flop to its two operating states, said flip-flop triggering to its set operating state in response to the application of an actuating signal to said second input at the same time that a certain signal condition is present on said first input and triggering to its reset state in response to the application of an actuating signal to said second input when a given signal condition is present on said third input;

means responsive to the three phase currents supplied to the three-phase load for providing first, second and third phase-displaced, control signals each of which is a function of and represents a respective one of the three phase currents;

means for applying said first, second and third control signals to said first, second and third inputs, respectively, said first and second control signals effecting actuation of said flip-flop to its set operating state when said predetermined desired phase sequence is present and said second and third control signals causing actuation of said flip-flop to its reset state if any other phase sequence exists;

and means responsive to and controlled by said flip-flop for providing an indication of the operating state of said flip-flop.

2. A digital logic phase sequence detector for monitoring the phase sequence of the three phase currents supplied by a three-phase AC power supply to a phase-sensitive, three-phase load to determine if a predetermined desired phase sequence exists, thereby determining whether the power supply is correctly connected to the load, comprising:

a flip-flop having set and reset operating states and having first, second and third inputs for actuating said flip-flop to its two operating states, said flip-flop triggering to its set operating state if a positive-going pulse transition is applied to said second input when said first input is established at a logic 1 signal level and actuating to its reset state if a positive-going pulse transition is applied to said second input when said third input is established at a logic 1 signal level, means responsive to the three phase currents supplied to the three-phase load for producing first, second and third phase-displaced, generally rectangular shaped logic signals each of which alternates between logic 1 and logic 0 levels and each of which represents and is a function of a respective one of the three phase currents, the logic 1 pulse components of said first logic signal embracing the positive-going transitions of said second logic signal and the logic 1 pulse components of said second logic signal overlapping the positive-going transitions of said third logic signal when said predetermined desired phase sequence is present;

means for applying said first, second and third logic signals to said first, second and third inputs, respectively, to establish said flip-flop in its set operating state if said predetermined desired phase sequence exists and in its reset operating state if said predetermined desired phase sequence is absent;

and means controlled by said flip-flop for providing an indication of the operating state of said flip-flop.

3. A digital logic phase sequence detector according to claim 2 and including means controlled by said flip-flop for disconnecting the load from the AC power supply when said flip-flop is in its reset operating state.

4. A digital logic phase sequence detector according to claim 2 in which said flip-flop is a J-K flip-flop having J, C and K inputs respectively constituting said first, second and third inputs.

5. A digital logic phase sequence detector according to claim 2 in which said first, second and third logic signals are produced by three voltage comparators to which are applied, respectively, three sinusoidal signals each of which is developed from a respective one of the three phase currents.

* * * * *